(12) United States Patent
Murayama

(10) Patent No.: US 11,876,349 B2
(45) Date of Patent: Jan. 16, 2024

(54) SEMICONDUCTOR DEVICE, SEMICONDUCTOR LASER, AND METHOD OF PRODUCING A SEMICONDUCTOR DEVICE

(71) Applicant: SONY SEMICONDUCTOR SOLUTIONS CORPORATION, Kanagawa (JP)

(72) Inventor: Masahiro Murayama, Miyagi (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 55 days.

(21) Appl. No.: 17/401,735

(22) Filed: Aug. 13, 2021

(65) Prior Publication Data

US 2021/0376571 A1 Dec. 2, 2021

Related U.S. Application Data

(62) Division of application No. 16/334,738, filed as application No. PCT/JP2017/033534 on Sep. 15, 2017, now Pat. No. 11,121,524.

(30) Foreign Application Priority Data

Nov. 1, 2016 (JP) .................... 2016-214555

(51) Int. Cl.
*H01S 5/042* (2006.01)
*H01S 5/22* (2006.01)
(Continued)

(52) U.S. Cl.
CPC ............ *H01S 5/22* (2013.01); *H01S 5/04253* (2019.08); *H01S 5/2059* (2013.01); *H01S 5/321* (2013.01);
(Continued)

(58) Field of Classification Search
CPC .... H01S 5/3203; H01S 5/1003; H01S 5/2206; H01S 5/22; H01S 5/04253
See application file for complete search history.

(56) References Cited

U.S. PATENT DOCUMENTS 5,355,384 A * 10/1994 Inoue .................. H01S 5/227
372/45.01
5,474,954 A * 12/1995 Yang .................... H01S 5/2231
438/39
(Continued)

FOREIGN PATENT DOCUMENTS

CN 1519998 A 8/2004
CN 103311398 A 9/2013
(Continued)

OTHER PUBLICATIONS

Office Action for CN Patent Application No. 201780066019.8, dated Mar. 4, 2021, 06 pages of Office Action and 07 pages of English Translation.
(Continued)

*Primary Examiner* — Michael Carter
(74) *Attorney, Agent, or Firm* — CHIP LAW GROUP

(57) ABSTRACT

To provide a semiconductor device, a semiconductor laser, and a method of producing a semiconductor device that are capable of sufficiently ensuring electrical connection between a transparent conductive layer and a semiconductor layer. [Solving Means] A semiconductor device according to the present technology includes: a first semiconductor layer; a second semiconductor layer; an active layer; and a transparent conductive layer. The first semiconductor layer has a first conductivity type, a stripe-shaped ridge being formed on a surface of the first semiconductor layer. A second width is not less than 0.99 and not more than 1.0 times a first width, a third width is not less than 0.96 and not more than 1.0 times the second width, and the transparent conductive layer (Continued)

has a uniform thickness within a range of not less than 90% and not more than 110% in a range of the third width, the first width being a width in a direction perpendicular to an extending direction of the ridge on a surface of the ridge on which the transparent conductive layer is formed, the second width being a width in the direction on a surface of the transparent conductive layer on a side of the ridge, the third width being a width in the direction on a surface opposite to the ridge of the transparent conductive layer.

9 Claims, 15 Drawing Sheets

(51) Int. Cl.
  *H01S 5/20* (2006.01)
  *H01S 5/32* (2006.01)
  *H01L 31/0224* (2006.01)

(52) U.S. Cl.
  CPC .... *H01S 5/3205* (2013.01); *H01L 31/022491* (2013.01)

(56) References Cited

U.S. PATENT DOCUMENTS

| | | | |
|---|---|---|---|
| 8,942,269 B2* | 1/2015 | Kasugai | B82Y 20/00 372/44.01 |
| 8,971,370 B1 | 3/2015 | Raring et al. | |
| 2002/0064199 A1* | 5/2002 | Takei | H01S 5/04254 372/46.012 |
| 2004/0245540 A1 | 12/2004 | Hata et al. | |
| 2006/0043388 A1 | 3/2006 | Kwak et al. | |
| 2011/0176568 A1 | 7/2011 | Satoh et al. | |
| 2011/0235666 A1 | 9/2011 | Sonobe et al. | |

FOREIGN PATENT DOCUMENTS

| | | |
|---|---|---|
| CN | 103444021 A | 12/2013 |
| EP | 2369697 A2 | 9/2011 |
| JP | 10-209559 A | 8/1998 |
| JP | 2004-260152 A | 9/2004 |
| JP | 2004-281431 A | 10/2004 |
| JP | 2004-289157 A | 10/2004 |
| JP | 2011-014891 A | 1/2011 |
| JP | 2011-222973 A | 11/2011 |
| JP | 2013-102043 A | 5/2013 |
| JP | 2015-167263 A | 9/2015 |
| WO | 2012/127778 A1 | 9/2012 |

OTHER PUBLICATIONS

Guotong Du, et al., "Physics of Semiconductor Laser Devices", Jilin University Press, May 31, 2002, pp. 246-248.
International Search Report and Written Opinion of PCT Application No. PCT/JP2017/033534, dated Feb. 6, 2018 11 pages of English Translation and 09 pages of ISRWO.
Notice of Allowance for U.S. Appl. No. 16/334,738 dated Jun. 23, 2021, 4 pages.
Non-Final Office Action for U.S. Appl. No. 16/334,738, dated Jan. 25, 2021, 11 pages.
Final Office Action for U.S. Appl. No. 16/334,738, dated Sep. 22, 2020, 10 pages.
International Preliminary Report on Patentability of PCT Application No. PCT/JP2017/033534, dated May 16, 2019, 10 pages of English Translation and 08 pages of IPRP.
Office Action for CN Patent Application No. 201780066019.8, dated Jul. 13, 2020, 05 pages of Office Action and 08 pages of English Translation.
Notice of Allowance for U.S. Appl. No. 16/334,738 dated May 11, 2021, 4 pages.
Non-Final Office Action for U.S. Appl. No. 16/334,738, dated Jun. 9, 2020, 11 pages.
Office Action for CN Patent Application No. 2017800660198, dated Aug. 30, 2021, 05 pages of English Translation and 06 pages of Office Action.

* cited by examiner

SEMICONDUCTOR DEVICE, SEMICONDUCTOR LASER, AND METHOD OF PRODUCING A SEMICONDUCTOR DEVICE

CROSS REFERENCE TO RELATED APPLICATIONS

This application is a divisional application of U.S. patent application Ser. No. 16/334,738, filed on Mar. 19, 2019, which is U.S. National Phase of International Patent Application No. PCT/JP2017/033534 filed on Sep. 15, 2017, which claims priority benefit of Japanese Patent Application No. JP 2016-214555 filed in the Japan Patent Office on Nov. 1, 2016. Each of the above-referenced applications is hereby incorporated herein by reference in its entirety.

TECHNICAL FIELD

The present technology relates to a technology of a semiconductor device such as a semiconductor laser.

BACKGROUND ART

The semiconductor laser is a semiconductor device that amplifies recombined light emission by stimulated emission and emit laser light, and has a feature of emitting laser light with a narrow radiation angle and high intensity. This semiconductor laser is applied to optical communication, optical pickup for optical disks, a laser printer, and the like. It is desired to further improve light output and reduce power consumption of the semiconductor laser.

The semiconductor laser has a current blocking structure to inject current into a predetermined area of an active layer sandwiched between a p-type semiconductor layer and an n-type semiconductor layer. The current blocking structure is realized by forming a stripe-shaped ridge in the p-type semiconductor layer or n-type semiconductor layer. A conductive material such as ITO (Indium Tin Oxide) is stacked on the ridge, and an electrode and the semiconductor layer are electrically connected to each other.

For example, Patent Literatures 1 and 2 each disclose a process flow of a semiconductor laser using a transparent conductive layer. In these process flows, after stacking a resist on a ridge, the resist on the ridge is removed and a transparent conductive layer is formed on the ridge by using this resist as a mask.

Further, Patent Literature 3 shows a semiconductor laser that uses a transparent conductive layer etched into a waveguide shape as a part of a cladding layer. Here, it is cited as a simple point in the process that only the transparent conductive layer is processed into a waveguide shape and a p-type layer is not processed.

CITATION LIST

Patent Literature

Patent Literature 1: Japanese Patent Application Laid-open No. 2011-014891
Patent Literature 2: Japanese Patent Application Laid-open No. 2015-167263
Patent Literature 3: Japanese Patent Application Laid-open No. 2004-289157

DISCLOSURE OF INVENTION

Technical Problem

However, in the process flow as described in Patent Literatures 1 or 2, it is difficult to form a transparent conductive layer up to the end of the ridge, and there is a possibility that voltage rise of the device or uneven current injection occurs due to a reduction in the contact area between the transparent conductive layer and the semiconductor layer. Further, in the structure described in Patent Literature 3, the light trapping effect in the lateral direction cannot be sufficiently achieved.

In view of the circumstances as described above, it is an object of the present technology to provide a semiconductor device and a semiconductor laser that are capable of sufficiently ensuring electrical connection between a transparent conductive layer and a semiconductor layer, and a method of producing the semiconductor device.

Solution to Problem

In order to achieve the above-mentioned object, a semiconductor device according to an embodiment of the present technology includes a first semiconductor layer; a second semiconductor layer; an active layer; and a transparent conductive layer.

The first semiconductor layer has a first conductivity type, a stripe-shaped ridge being formed on a surface of the first semiconductor layer.

The second semiconductor layer has a second conductivity type.

The active layer is provided between the first semiconductor layer and the second semiconductor layer.

The transparent conductive layer is formed of a transparent conductive material and formed in the ridge.

The second width is not less than 0.99 and not more than 1.0 times a first width, a third width is not less than 0.96 and not more than 1.0 times the second width, and the transparent conductive layer has a uniform thickness within a range of not less than 90% and not more than 110% in a range of the third width, the first width being a width of a surface of the ridge on which the transparent conductive layer is formed in a direction perpendicular to an extending direction of the ridge, the second width being a width of a surface of the transparent conductive layer on a side of the ridge in the direction, the third width being a width of a surface of the transparent conductive layer opposite to the ridge in the direction.

With the above-mentioned configuration, the transparent conductive layer is formed to have a uniform thickness on substantially the entire surface of the first semiconductor layer in the ridge. As a result, it is possible to achieve the wide contact area between the transparent conductive layer and the first semiconductor layer in the ridge, and reduce voltage of the semiconductor device. Further, it is possible to inject current uniformly from the entire upper surface of the ridge, and suppress the non-uniform injection of carriers into the active layer. Therefore, it is possible to suppress uneven light emission spreading.

The semiconductor device may further include a pad electrode that is formed of a conductive material and comes into contact with the transparent conductive layer, in which the pad electrode may include an intermediate layer formed on a connection part between the pad electrode and the transparent conductive layer, constituent elements of the pad electrode and constituent elements of the transparent conductive layer being fused in the intermediate layer.

With this configuration, it is possible to improve the adhesion between the pad electrode and the transparent conductive layer by the intermediate layer.

The semiconductor device may further include a metal electrode that is formed of a metal material and formed on the transparent conductive layer, in which the metal electrode may include an intermediate layer formed on a connection part between the metal electrode and the transparent conductive layer, constituent elements of the metal electrode and constituent elements of the transparent conductive layer being fused in the intermediate layer.

With this configuration, it is possible to improve the adhesion between the metal electrode and the transparent conductive layer by the intermediate layer.

A fourth width may be not less than 0.99 and not more than 1.0 times the third width, the fourth width being a width of a surface of the metal electrode on a side of the transparent conductive layer in the direction.

In order to achieve the above-mentioned object, a semiconductor laser according to an embodiment of the present technology includes: a first semiconductor layer; a second semiconductor layer; an active layer; and a transparent conductive layer.

The first semiconductor layer has a first conductivity type, a stripe-shaped ridge being formed on a surface of the first semiconductor layer.

The second semiconductor layer has a second conductivity type.

The active layer is provided between the first semiconductor layer and the second semiconductor layer.

The transparent conductive layer is formed of a transparent conductive material and formed in the ridge.

The second width is not less than 0.99 and not more than 1.0 times a first width, a third width is not less than 0.96 and not more than 1.0 times the second width, and the transparent conductive layer has a uniform thickness within a range of not less than 90% and not more than 110% in a range of the third width, the first width being a width of a surface of the ridge on which the transparent conductive layer is formed in a direction perpendicular to an extending direction of the ridge, the second width being a width of a surface of the transparent conductive layer on a side of the ridge in the direction, the third width being a width of a surface of the transparent conductive layer opposite to the ridge in the direction.

In order to achieve the above-mentioned object, a method of producing a semiconductor device according to an embodiment of the present technology includes: preparing a laminate including a first semiconductor layer having a first conductivity type, a second semiconductor layer having a second conductivity type, and an active layer provided between the first semiconductor layer and the second semiconductor layer.

A transparent conductive layer is formed on the first semiconductor layer, the transparent conductive layer being formed of a transparent conductive material.

A mask structure processed into a stripe shape is formed on the transparent conductive layer.

At least a part of the transparent conductive layer and the first semiconductor layer is removed by etching using the mask structure as an etching mask.

With this production method, since the transparent conductive layer is etched using the mask structure, it is possible to form the transparent conductive layer to have a uniform thickness on substantially the entire surface of the first semiconductor layer in the ridge.

The mask structure may be formed of a dielectric.

The forming the mask structure may further include forming a dielectric layer on the transparent conductive layer, the dielectric layer being formed of a dielectric, forming a photoresist on the dielectric layer, patterning the photoresist into a stripe shape, and etching the dielectric layer using the photoresist as an etching mask.

The mask structure may be formed of metal.

The forming the mask structure may further include forming a photoresist on the transparent conductive layer, patterning the photoresist into a shape having a stripe-shaped opening, forming a metal layer on the transparent conductive layer and the photoresist, and removing the photo resist and the metal layer formed on the photoresist.

The forming the mask structure may further include forming a metal layer on the transparent conductive layer, forming a photoresist on the metal, patterning the photoresist into a stripe shape, and etching the metal layer using the photoresist as an etching mask.

After the removing at least a part of the transparent conductive layer and the first semiconductor layer by etching, a pad electrode that comes into contact with the transparent conductive layer may be formed; and an intermediate layer may be formed in a connection part between the pad electrode and the transparent conductive layer by heat treatment, constituent elements of the pad electrode and constituent elements of the transparent conductive layer being fused in the intermediate layer.

After forming the metal layer on the transparent conductive layer, an intermediate layer may be formed in a connection part between the metal layer and the transparent conductive layer by heat treatment, constituent elements of the metal layer and constituent elements of the transparent conductive layer being fused in the intermediate layer.

Advantageous Effects of Invention

As described above, in accordance with the present technology, it is possible to provide a semiconductor device and a semiconductor laser that are capable of ensuring electrical connection between a transparent conductive layer and a semiconductor layer, and a method of producing the semiconductor device. It should be noted that the effect described here is not necessarily limitative and may be any effect described in the present disclosure.

MODE(S) FOR CARRYING OUT THE INVENTION

First Embodiment

A semiconductor device according to a first embodiment of the present technology will be described.

[Structure of Semiconductor Device]

Figure 1:
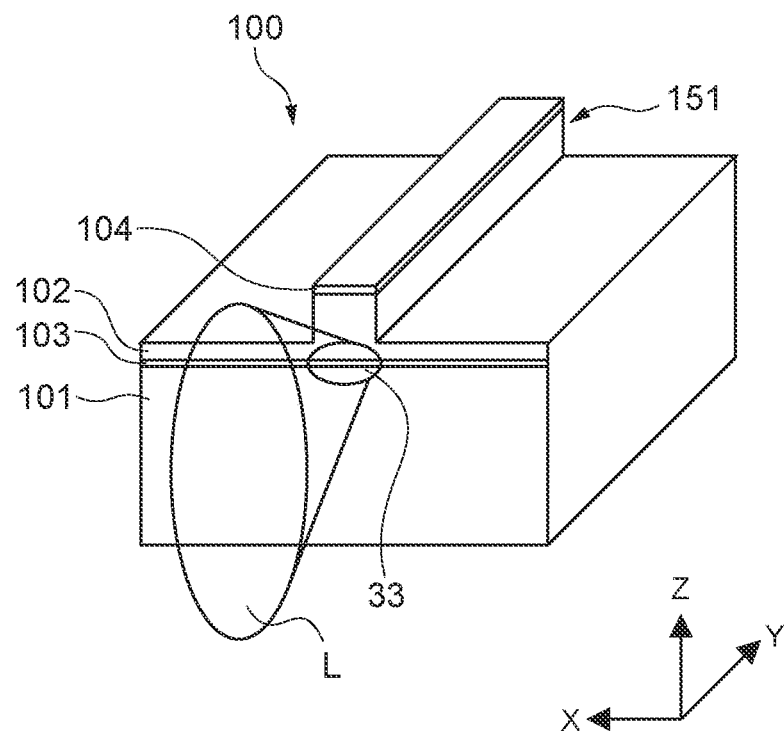
FIG. 1 is a perspective view of a semiconductor device according to a first embodiment of the present technology.
Figure 2:
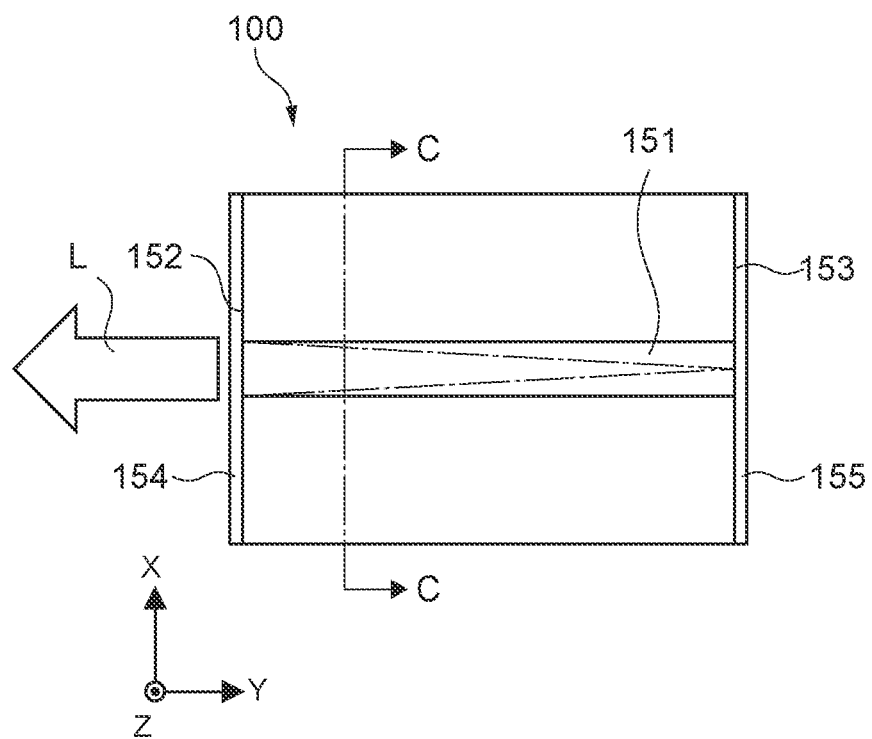
FIG. 2 is a plan view of the semiconductor device.
Figure 3:
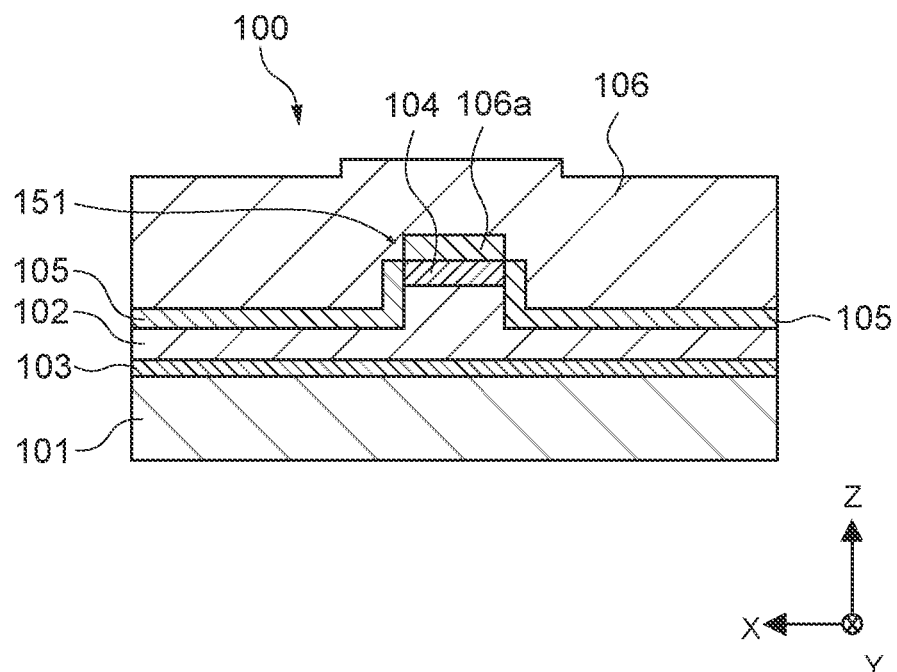
FIG. 3 is a cross-sectional view of the semiconductor device.

FIG. 1 is a schematic perspective view showing a semiconductor device 100 according to a first embodiment. FIG. 2 is a plan view thereof. FIG. 3 is a cross-sectional view taken along the line C-C in FIG. 2. The semiconductor device 100 is a ridge-type semiconductor laser including a ridge 151 in a p-type conductive layer. Note that the semiconductor device 100 is not limited to a semiconductor laser, and may be an SLD (Super Luminescent Diode), an LED (light emitting diode), or another semiconductor device.

As shown in FIG. 3, the semiconductor device 100 includes an n-type layer 101, a p-type layer 102, an active layer 103, a transparent conductive layer 104, a dielectric layer 105, and a pad electrode 106. The n-type layer 101, the active layer 103, and the p-type layer 102 are stacked in the stated order, and the p-type layer 102 forms the stripe-shaped ridge 151. Note that in FIG. 1 and FIG. 2, illustration of the pad electrode 106 and the dielectric layer 105 is omitted. As shown in FIG. 2, the semiconductor device 100 has a light emitting end surface 152 and a rear end surface 153 that is an end surface opposite to the light emitting end surface 152.

As shown in FIG. 2, the ridge 151 is formed linearly from the rear end surface 153 to the light emitting end surface 152. Hereinafter, the direction in which the ridge 151 extends will be referred to as Y direction. Note that the ridge 151 does not necessarily need to be linear, and may be curved.

The n-type layer 101 is formed of a group III-V nitride semiconductor such as AlN, GaN, AlGaN, AlInGaN, and InN. Specifically, gallium nitride compound semiconductors such as $In_yAl_zGa_{1-y-z}N$ ($0 \leq y$, $0 \leq z$, $y+z \leq 1$) and $Al_xGa_{1-x}N$ ($0 < x < 1$) are favorable. The constituent material of the n-type layer 101 is doped with an n-type impurity such as Si and Ge, and has an n-type conductivity. The n-type layer 101 can be formed on a substrate (not shown) formed of sapphire, silicon, ZnO, GaAs, GaN, InGaN, AlInGaN, AlGaN, AlN, InN, or the like.

The p-type layer 102 forms a current blocking structure. Specifically, an area from the p-type layer 102 to the active layer 103 for injecting current is narrowed by the structure of the ridge 151. As a result, an optical waveguide along the extending direction (Y direction) of the ridge 151 is formed in the vicinity of the ridge 151 in the active layer 103.

The p-type layer 102 is formed of a group III-V nitride semiconductor such as AlN, GaN, AlGaN, AlInGaN, and InN. Specifically, gallium nitride compound semiconductors such as $In_yAl_zGa_{1-y-z}N$ ($0 \leq y$, $0 \leq z$, $y+z \leq 1$) and $Al_xGa_{1-x}N$ ($0 < x < 1$) are favorable. The constituent material of the p-type layer 102 is doped with a p-type impurity such as Mg and Zn, and has a p-type conductivity.

The active layer 103 is provided between the n-type layer 101 and the p-type layer 102. The material of the active layer 103 is not particularly limited. However, the light emission color of the semiconductor device 100 differs depending on the material of the active layer 103. For example, in the case where the active layer 103 if formed of AlInGaP, red light of a light emission wavelength of 550 to 900 nm (practical range of 630 to 680 nm) is generated. Further, in the case where the active layer 103 is formed of AlInGaN, blue-violet to green light of a light emission wavelength of 400 to 1000 nm (practical range of 400 to 550 nm) is generated.

In addition, examples of the material of the active layer 103 include AlGaN (light emission wavelength of ultraviolet region to 400 nm), AlGaAs (light emission wavelength of 750 to 850 nm, infrared region), InGaAs (light emission wavelength of 800 to 980 nm, infrared region), and InGaAsP (light emission wavelength of 1.2 to 1.6 μm, infrared region).

The active layer 103 has a band gap smaller than those of surrounding layers (the n-type layer 101 and the p-type layer 102), and forms a quantum well. When current is applied between the p-type layer 102 and the n-type layer 101, electrons in a conduction band (CB) recombine with holes of a valence band (VB) via the band gap of the quantum well, resulting in light emission.

The transparent conductive layer 104 is formed in the ridge 151, and electrically connects the pad electrode 106 and the p-type layer 102. The transparent conductive layer 104 is formed of a conductive material having optical transparency such as ITO (Indium Tin Oxide), ZnO, and IGZO (Indium Gallium Zinc Oxide). Among them, ITO is particularly favorable in view of ohmic contact with a p-type nitride semiconductor or light absorption. Details of the transparent conductive layer 104 will be described later.

The dielectric layer 105 is formed on the p-type layer 102 and on the side surface of the ridge 151, and insulates the pad electrode 106 and the p-type layer 102 from each other. The material of the dielectric layer 105 is not particularly limited. However, a material having a refractive index smaller than that of the p-type layer 102 is favorable for efficiently trapping light in the ridge 151. For example, $SiO_2$ can be used.

The pad electrode 106 is formed on the transparent conductive layer 104 and the dielectric layer 105 so as to cover the ridge 151. The pad electrode 106 is formed of metal. Further, the pad electrode 106 may be formed of a plurality of materials. For example, in the case where the transparent conductive layer 104 is formed of oxide, by forming a part in contact with the transparent conductive layer 104 with a material such as Ti, Ni, and Al, which is likely to form oxide, it is possible to improve the adhesion between the pad electrode 106 and the transparent conductive layer 104. For example, the pad electrode 106 may have a stacked structure of Ti/Pt/Au.

As shown in FIG. 3, an intermediate layer 106a is formed on the pad electrode 106. The intermediate layer 106a is a layer in which the constituent elements of the transparent conductive layer 104 and the constituent elements of the pad electrode 106 are fused. For example, in the case where the transparent conductive layer 104 is formed of ITO and the pad electrode 106 is formed of Ti/Pt/A, the intermediate layer 106a has a structure having mixed crystals of In, Sn, O, and Ti. With the intermediate layer 106a, it is possible to improve the adhesion between the transparent conductive layer 104 and the pad electrode 106.

As shown in FIG. 2, a low reflection mirror film 154 is provided on the light emitting end surface 152, and a high reflection mirror film 155 is provided on the rear end surface 153 opposite thereto.

When current is applied between the p-type layer 102 and the n-type layer 101, spontaneous emission light is generated in the active layer 103 in the vicinity of the rear end surface 153. The spontaneous emission light is amplified by stimulated emission while travelling through the optical waveguide toward the light emitting end surface 152. Light travelling toward the rear end surface 153 of the spontaneous emission light is reflected by the high reflection mirror film 155, and amplified while travelling toward the light emitting end surface 152. The amplified light is emitted from the light emitting end surface 152 via the low reflection mirror film 154. FIG. 1 and FIG. 2 each show an emitted light L of the semiconductor device 100.

Note that instead of the high reflection mirror film 155, a low reflection mirror film may be provided on the rear end surface 153. In this case, the emitted light is output from both ends of the semiconductor device 100.

The semiconductor device 100 can be used as a semiconductor laser. Meanwhile, the semiconductor device 100 can be used also as an amplifier for amplifying light generated by another light source. In this case, instead of the high reflection mirror film 155, a non-reflection film is provided. The light generated in another light source enters an optical waveguide via the non-reflection film, and is amplified while travelling through the optical waveguide.

[Regarding Transparent Conductive Layer]

Figure 4:
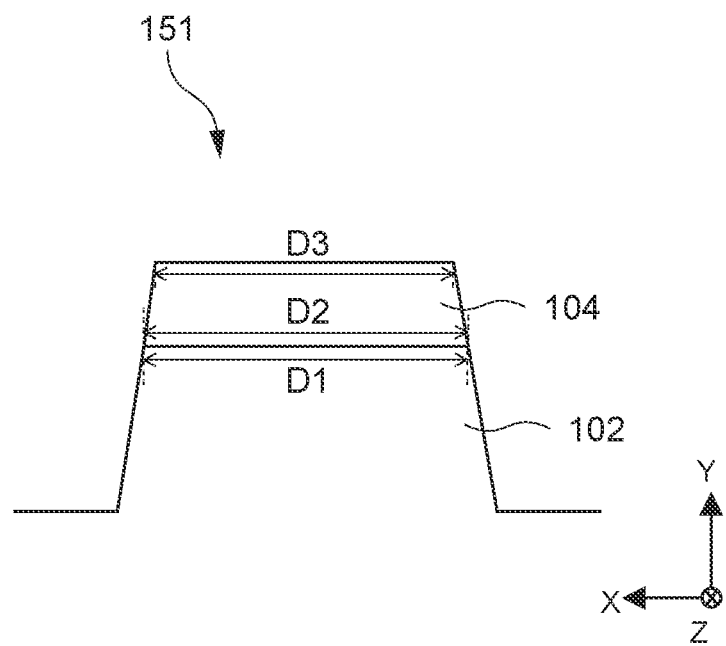
FIG. 4 is a schematic diagram showing a shape of a transparent conductive layer of the semiconductor device.

The transparent conductive layer 104 of the semiconductor device 100 has a predetermined shape. FIG. 4 is a schematic diagram showing the shape of the transparent conductive layer 104.

As shown in the figure, the width of the upper surface of the p-type layer 102 in the ridge 151 in the direction (X direction) perpendicular to the extending direction (Y direction) of the ridge 151 is a width D1, the width of the surface of the transparent conductive layer 104 on the side of the p-type layer 102 in the X direction is a width D2, and a width of the surface of the transparent conductive layer 104 opposite to the p-type layer 102 in the X direction is a width D3.

At this time, D1, D2, and D3 have the relationship represented by the following [Formula 1] and [Formula 2].

$$0.99 \times D1 \leq D2 \leq D1 \quad \text{[Formula 1]}$$

$$0.96 \times D2 \leq D3 \leq D2 \quad \text{[Formula 2]}$$

Further, within the range of D3, the transparent conductive layer 104 has a uniform thickness (Z direction) in the range of not less than 90% to not more than 110%.

As described above, the transparent conductive layer 104 is stacked on substantially the entire surface of the p-type layer 102 in the ridge 151 to have a uniform thickness. Such a shape of the transparent conductive layer 104 can be realized by the production method to be described later.

As a result, it is possible to achieve the wide contact area between the transparent conductive layer 104 and the p-type layer 102 in the ridge 151, and reduce voltage of the semiconductor device 100. Further, it is possible to inject current uniformly from the entire upper surface of the ridge 151, and suppress the non-uniform injection of carriers into the active layer 103. Therefore, it is possible to suppress uneven light emission spreading.

The semiconductor device 100 has the configuration described above. Note that although the ridge 151 is formed on the p-type layer 102 in the above description, the p-type layer 102, the active layer 103, and the n-type layer 101 may be stacked in the stated order and the ridge may be formed on the n-type layer 101.

[Method of Producing Semiconductor Device]

A method of producing the semiconductor device 100 will be described. FIGS. 5A, 5B, 5C, 6A, 6B, 6C, 7A, 7B, 7C, and 8 are each a schematic diagram showing a process of producing the semiconductor device 100.

Figure 5A:
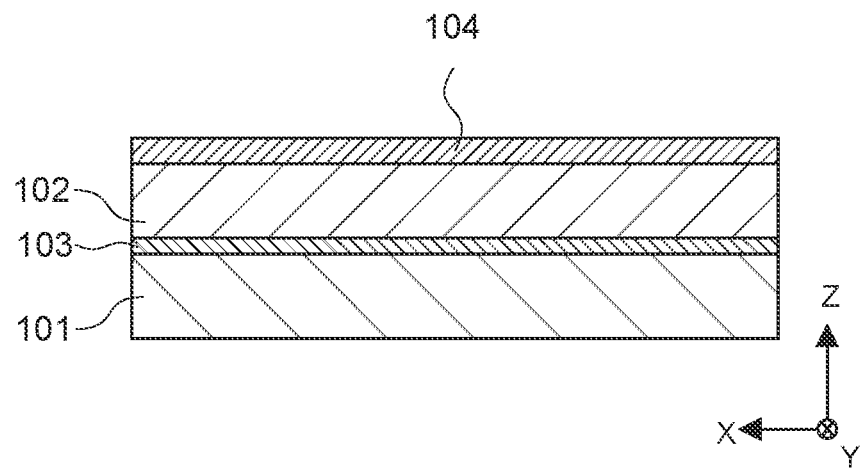
FIGS. 5A, 5B, and 5C are schematic diagrams showing a process of producing the semiconductor device.

As shown in FIG. 5A, the transparent conductive layer 104 is formed on the p-type layer 102 of the laminate obtained by stacking the n-type layer 101, the active layer 103, and the p-type layer 102. The transparent conductive layer 104 can be formed by a method such as vapor deposition, sputtering, and plasma CVD (chemical vapor deposition). After forming the transparent conductive layer 104, annealing treatment may be performed. As a result, it is possible to realize favorable ohmic characteristics to the p-type layer 102.

Figure 5B:
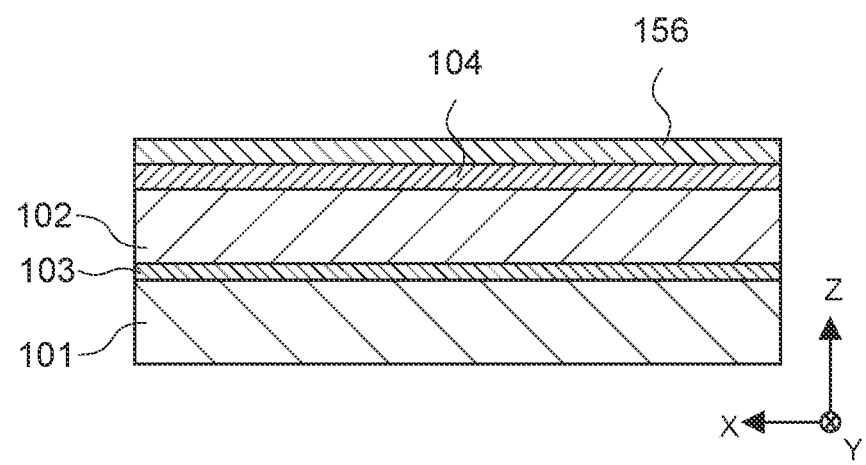

Subsequently, as shown in FIG. 5B, a dielectric layer 156 is formed on the transparent conductive layer 104. The type of the dielectric layer 156 is not particularly limited. However, $SiO_2$ is favorable in view of ease of deposition and processing. The dielectric layer 156 can be formed by a method such as deposition, sputtering, and plasma CVD.

Figure 5C:
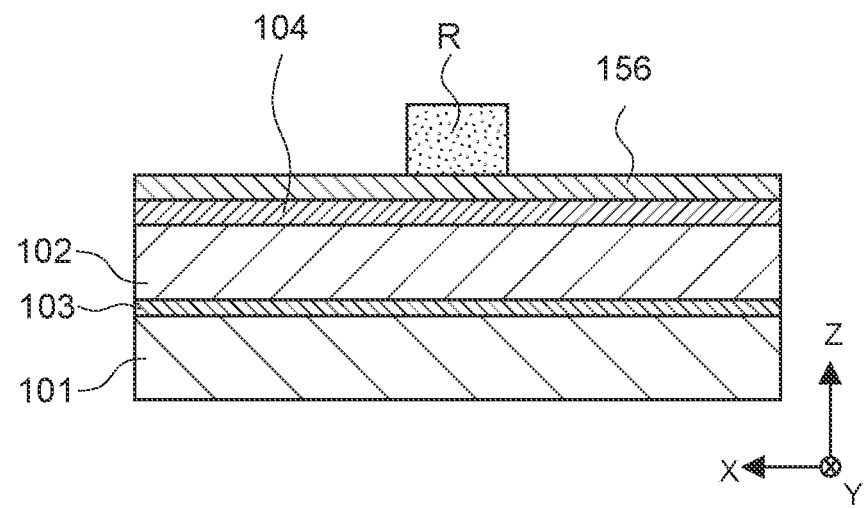

Subsequently, a photoresist is formed on the dielectric layer 156 and patterned to form a photoresist R as shown in FIG. 5C. The photoresist R is patterned into a stripe shape extending along the Y direction.

Figure 6A:
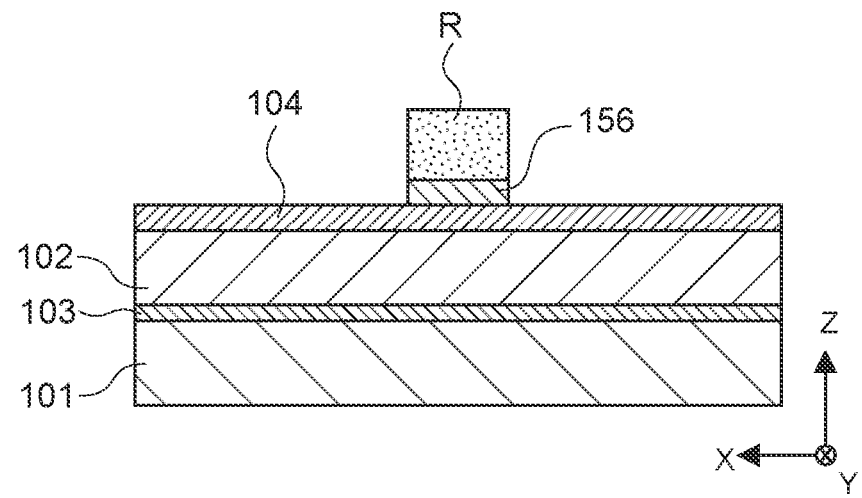
FIGS. 6A, 6B, and 6C are schematic diagrams showing a process of producing the semiconductor device.

Subsequently, the dielectric layer 156 is etched using the photoresist R as a mask, and the dielectric layer 156 is processed into a stripe shape as shown in FIG. 6A. For etching, dry etching or wet etching can be used. As an etchant, for example, a fluorine-based gas can be used.

Figure 6B:
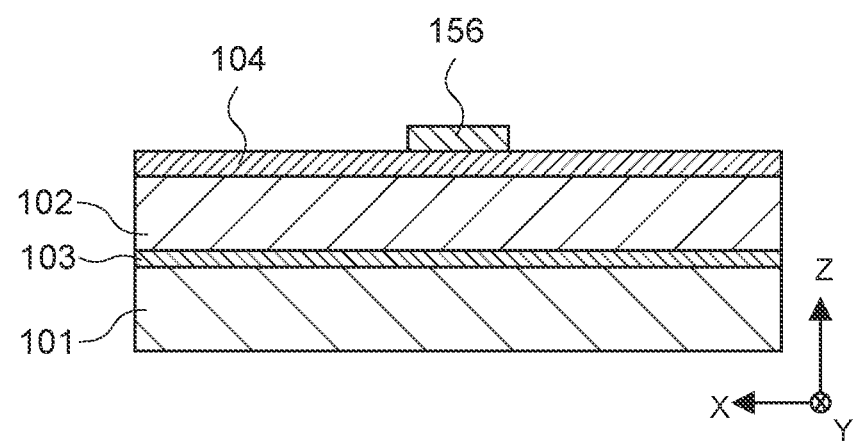

Subsequently, the photoresist R is removed as shown in FIG. 6B.

Figure 6C:
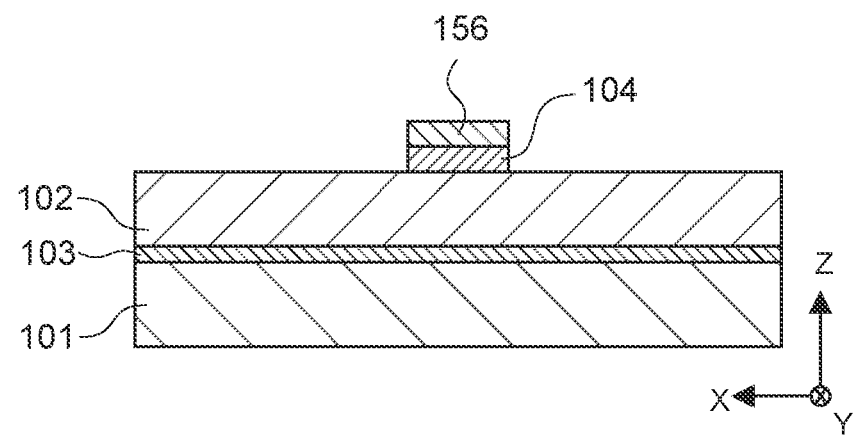

Subsequently, as shown in FIG. 6C, the transparent conductive layer 104 is etched using the dielectric layer 156 processed into a stripe shape as a mask to process the transparent conductive layer 104 into a stripe shape. For etching, dry etching or wet etching can be used. However, dry etching is favorable in view of control of the stripe width and flatness of the processed side surface. As an etchant, for example, a chlorine-based gas can be used.

Figure 7A:
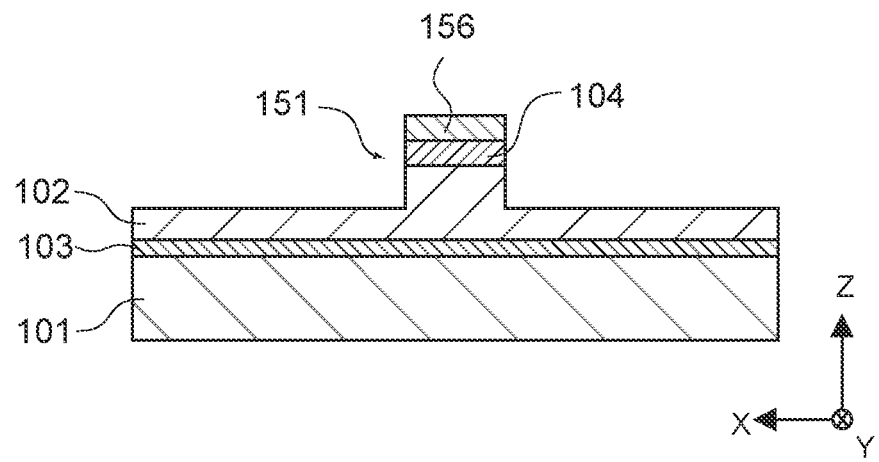
FIGS. 7A, 7B, and 7C are schematic diagrams showing a process of producing the semiconductor device.

Subsequently, as shown in FIG. 7A, at least a part of the p-type layer 102 is etched using the dielectric layer 156 and the transparent conductive layer 104 that have been processed into a stripe shape as a mask to form the ridge 151. As an etchant, for example, a chlorine-based gas can be used. Note that this step may be performed separately from or together with the etching of the transparent conductive layer 104 (FIG. 6C). By forming the ridge 151 by this method, the transparent conductive layer 104 can be made to have a uniform thickness on the upper surface of the ridge 151, and the wide contact area between the transparent conductive layer 104 and the p-type layer 102 can be achieved.

Figure 7B:
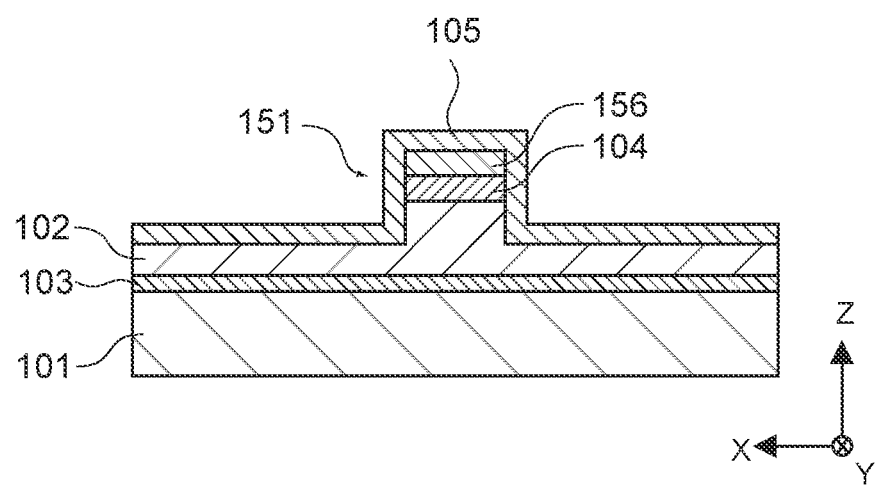
Figure 7C:
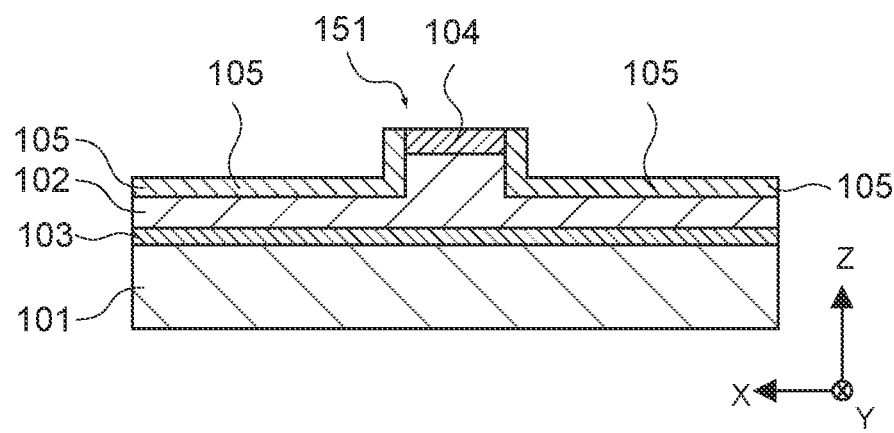

Subsequently, as shown in FIG. 7B, the dielectric layer 105 is formed on the p-type layer 102, the transparent conductive layer 104, and the dielectric layer 156. Subsequently, as shown in FIG. 7C, the dielectric layer 105 on the ridge 151 is removed to expose the transparent conductive layer 104.

Figure 8:
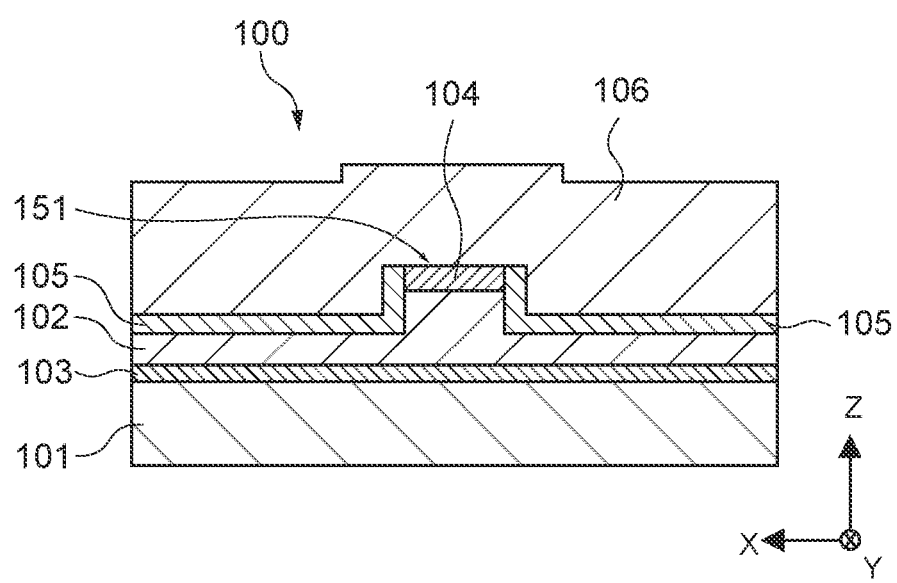
FIG. 8 is a schematic diagram showing a process of producing the semiconductor device.

Subsequently, as shown in FIG. 8, the pad electrode 106 is formed so as to cover the entire ridge 151.

Subsequently, as shown in FIG. 3, the intermediate layer 106a is formed. The intermediate layer 106a can be formed by mixing the constituent elements of the transparent conductive layer 104 and the constituent elements of the pad electrode 106 by heat treatment.

The semiconductor device 100 can be produced in this way. In this production method, the transparent conductive layer 104 can be formed to have a uniform thickness on substantially the entire surface of the p-type layer 102 in the ridge 151.

Second Embodiment

A semiconductor device according to a second embodiment of the present technology will be described.

[Structure of Semiconductor Device]

Figure 9:
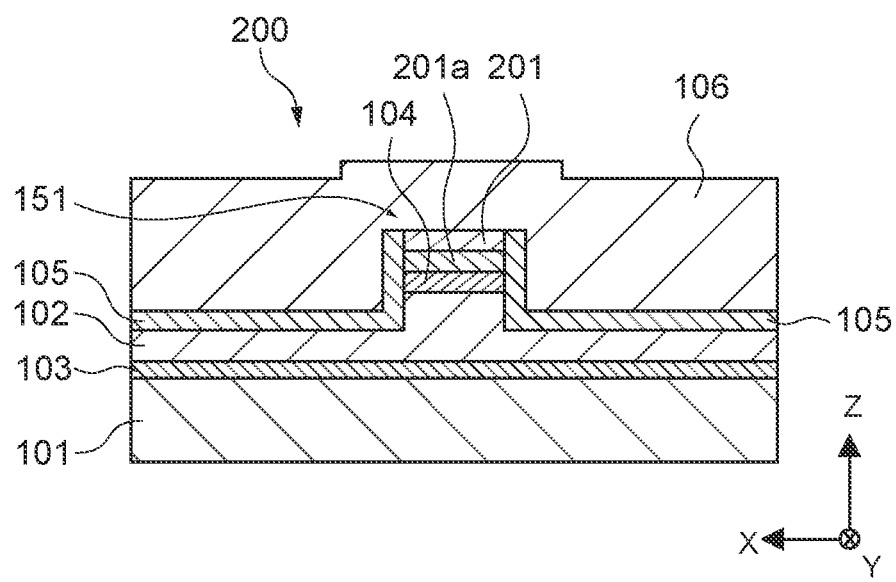
FIG. 9 is a cross-sectional view of a semiconductor device according to a second embodiment of the present technology.

FIG. 9 is a plan view of a semiconductor device 200 according to a second embodiment. The semiconductor device 200 is different from the semiconductor device 100 according to the first embodiment in that a p electrode 201 is provided. Since other configurations are similar to those in the semiconductor device 100, they are denoted by the same reference symbols, and description thereof will be omitted.

The p electrode 201 is provided between the transparent conductive layer 104 and the pad electrode 106. The p electrode 201 is formed of metal. Further, the p electrode 201 may be formed of a plurality of materials. For example, in the case where the transparent conductive layer 104 is formed of oxide, by forming a part in contact with the transparent conductive layer 104 with a material such as Ti, Ni, and Al, which is likely to form oxide, it is possible to improve the adhesion between the p electrode 201 and the transparent conductive layer 104. For example, the p electrode 201 may have a stacked structure of Ti/Pt/Au.

As shown in FIG. 9, an intermediate layer 201a is formed on the p electrode 201. The intermediate layer 201a is a layer in which the constituent elements of the transparent conductive layer 104 and the constituent elements of the p electrode 201 are fused. For example, in the case where the transparent conductive layer 104 is formed of ITO and the p electrode 201 is formed of Ti/Pt/A, the intermediate layer 201a has a structure having mixed crystals of In, Sn, O, and Ti. With the intermediate layer 201a, it is possible to improve the adhesion between the transparent conductive layer 104 and the p electrode 201.

Figure 10:
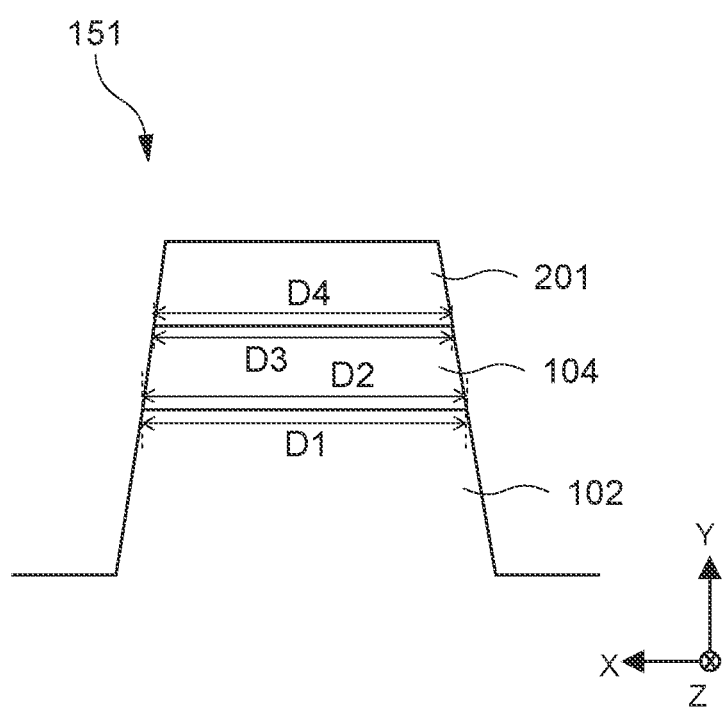
FIG. 10 is a schematic diagram showing a shape of a p electrode of the semiconductor device.

FIG. 10 is a schematic diagram showing the shape of the p electrode 201. As shown in the figure, a width of a surface of the p electrode 201 on the side of the transparent conductive layer 104 in the direction (X direction) perpendicular to the extending direction (Y direction) of the ridge 151 is a width D4. D1, D2, and D3 are similar to those in the first embodiment.

At this time, D3 and D4 have the relationship represented by the following [Formula 3].

$$0.99 \times D3 \leq D4 \leq 1.0 \times D3 \quad \text{[Formula 3]}$$

The semiconductor device 200 has the configuration described above. Note that although the ridge 151 is formed on the p-type layer 102 in the above description, the p-type layer 102, the active layer 103, and the n-type layer 101 may be stacked in the stated order and the ridge may be formed on the n-type layer 101. In this case, an n electrode is provided instead of the p electrode 201. Also in the n electrode, an intermediate layer in which the constituent elements of the transparent conductive layer and the constituent elements of the n electrode are fused may be provided.

[Method 1 of Producing Semiconductor Device]

A method 1 of producing the semiconductor device 200 will be described. FIGS. 11A, 11B, 11C, 12A, 12B, 12C, 13A, 13B, and 13C are each a schematic diagram showing a process of producing the semiconductor device 200.

Figure 11A:
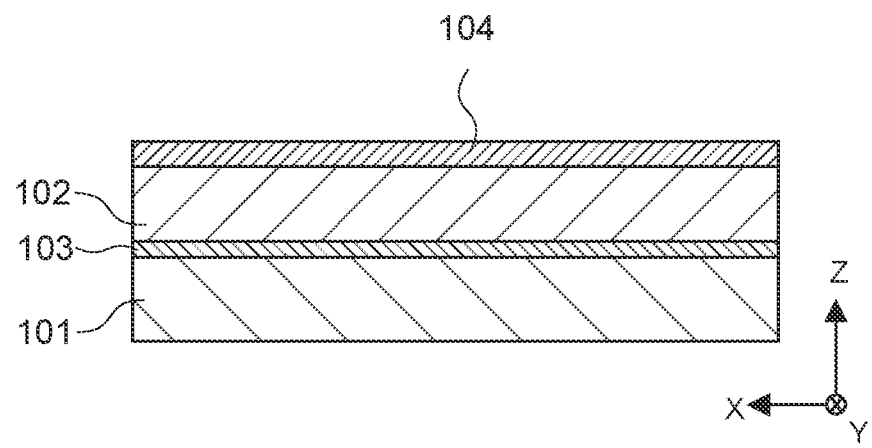
FIGS. 11A, 11B, and 11C are schematic diagrams showing a first process of producing the semiconductor device.

As shown in FIG. 11A, the transparent conductive layer 104 is formed on the p-type layer 102 of the laminate obtained by stacking the n-type layer 101, the active layer 103, and the p-type layer 102. The transparent conductive layer 104 may be formed by a method such as vapor deposition, sputtering and plasma CVD (chemical vapor deposition). After forming the transparent conductive layer 104, annealing treatment may be performed. As a result, it is possible to realize favorable ohmic characteristics to the p-type layer 102.

Figure 11B:
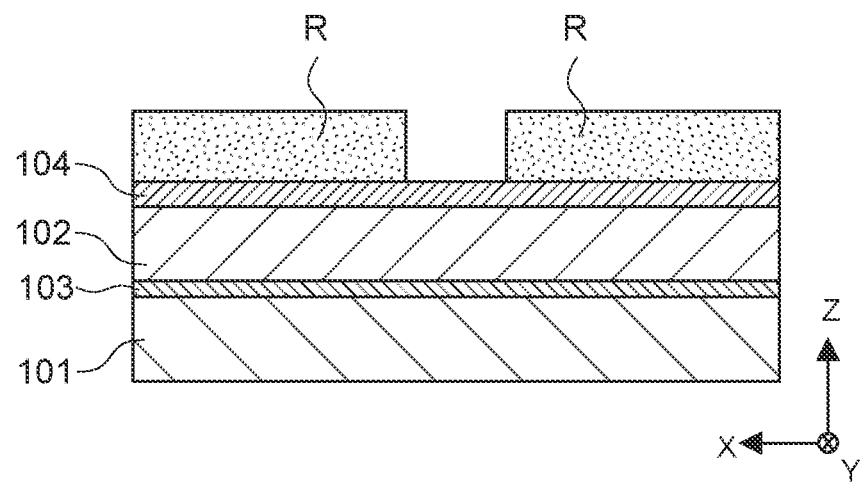

Subsequently, a photoresist is formed on the transparent conductive layer 104 and patterned to form the photoresist R as shown in FIG. 11B. In the photoresist R, a stripe-shaped opening extending along the Y direction is formed.

Figure 11C:
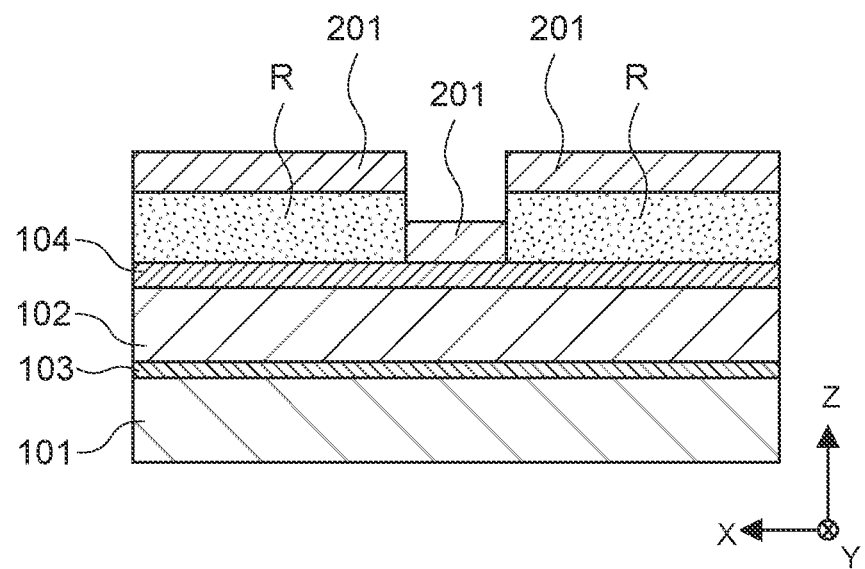

Subsequently, as shown in FIG. 11C, the p electrode 201 is formed on the photoresist R and the transparent conductive layer 104.

Figure 12A:
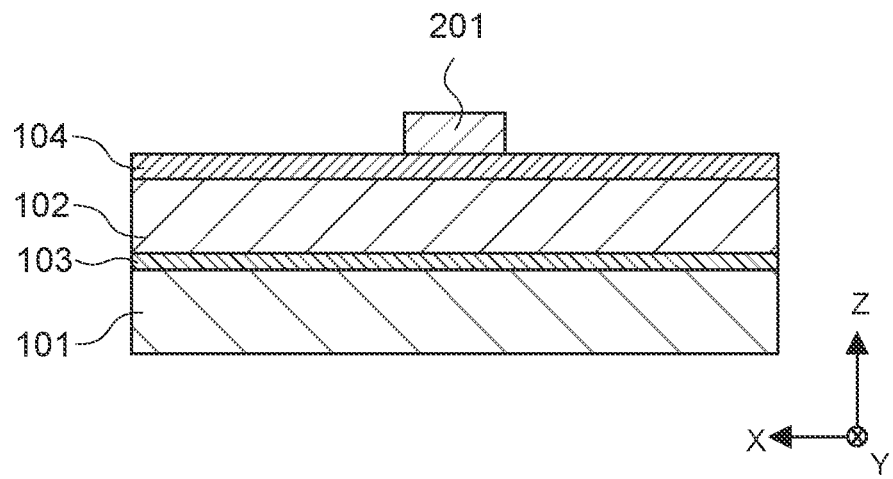
FIGS. 12A, 12B, and 12C are schematic diagrams showing the first process of producing the semiconductor device.

Subsequently, as shown in FIG. 12A, the photoresist R is removed. As a result, also the p electrode 201 formed on the photoresist R is removed, and the stripe-shaped p electrode 201 is formed on the transparent conductive layer 104.

Figure 12B:
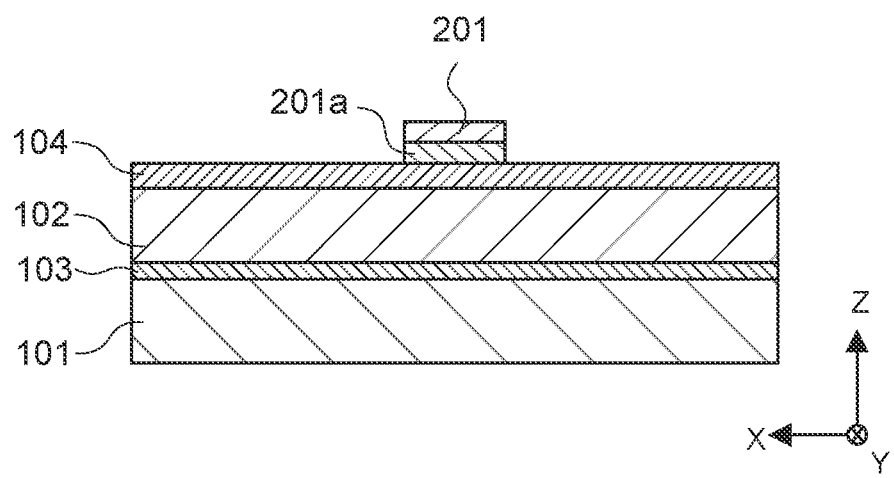

Subsequently, as shown in FIG. 12B, the intermediate layer 201a is formed. The intermediate layer 201a can be performed by mixing the constituent elements of the transparent conductive layer 104 and the constituent elements of the p electrode 201 by heat treatment.

Figure 12C:
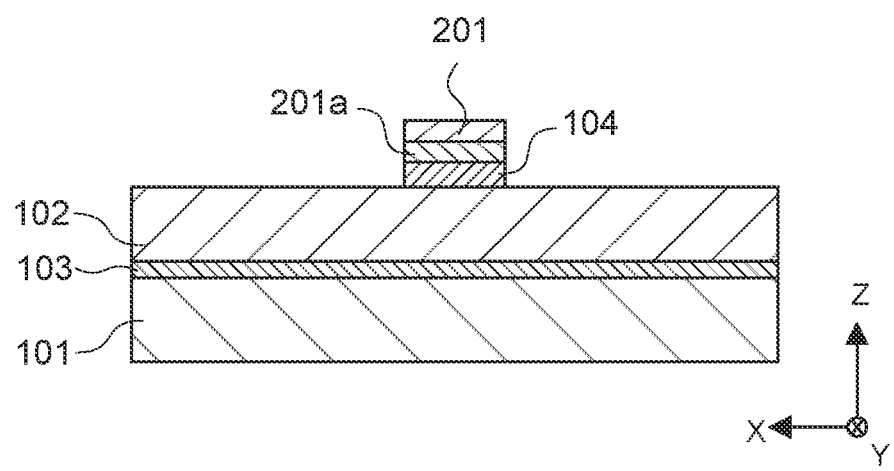

Subsequently, as shown in FIG. 12C, the transparent conductive layer 104 is etched using the p electrode 201 processed into a stripe shape as a mask to process the transparent conductive layer 104 into a stripe shape. For etching, dry etching or wet etching can be used. However, dry etching is favorable in view of control of the stripe width and flatness of the processed side surface. As an etchant, for example, a chlorine-based gas can be used.

Figure 13A:
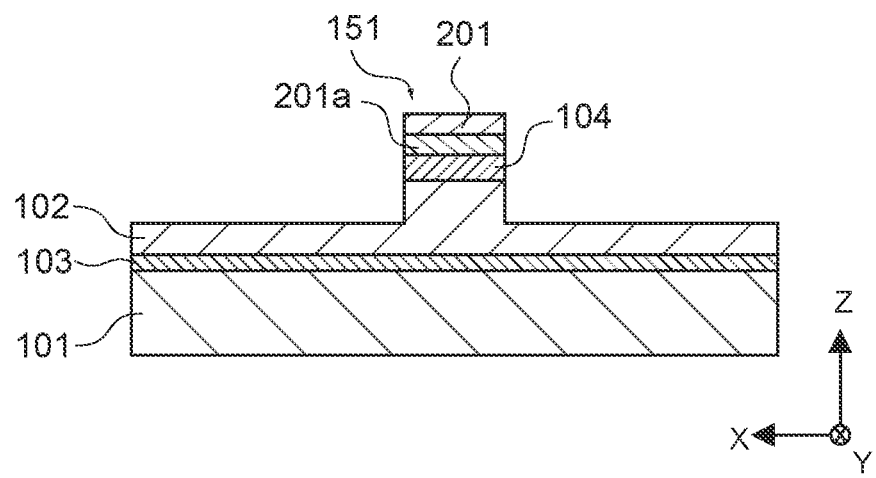
FIGS. 13A, 13B, and 13C are schematic diagrams showing the first process of producing the semiconductor device.

Subsequently, as shown in FIG. 13A, at least a part of the p-type layer 102 is etched using the p electrode 201 and the transparent conductive layer 104 that have been processed into a stripe shape as a mask to form the ridge 151. As an etchant, for example, a chlorine-based gas can be used. Note that this step may be performed separately from or together with the etching of the transparent conductive layer 104 (FIG. 12C). By forming the ridge 151 by this method, the transparent conductive layer 104 can be made to have a uniform thickness on the upper surface of the ridge 151, and the wide contact area between the transparent conductive layer 104 and the p-type layer 102 can be achieved.

Figure 13B:
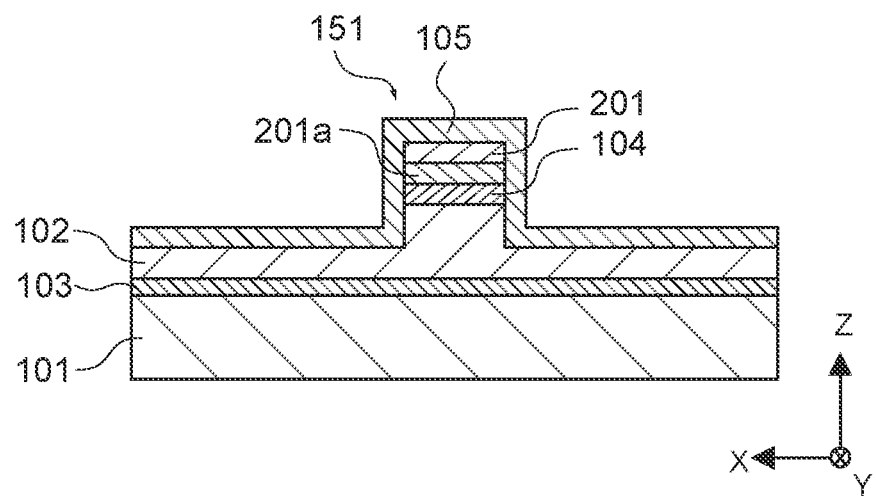

Subsequently, as shown in FIG. 13B, the dielectric layer 105 is formed on the p-type layer 102, the transparent conductive layer 104, and the p electrode 201.

Figure 13C:
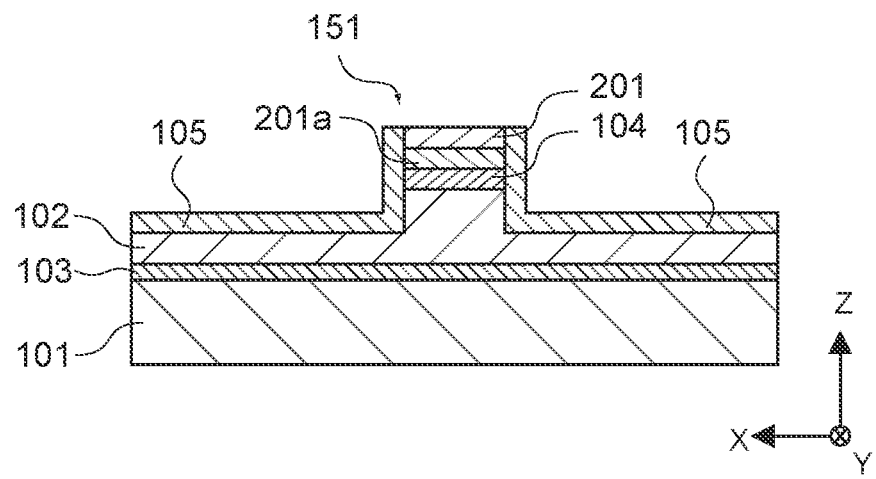

Subsequently, as shown in FIG. 13C, the dielectric layer 105 on the ridge 151 is removed to expose the p electrode 201.

Subsequently, as shown in FIG. 9, the pad electrode 106 is formed so as to cover the entire ridge 151.

The semiconductor device 200 can be produced in this way. In this production method, the transparent conductive layer 104 can be made to have a uniform thickness on substantially the entire surface of the p-type layer 102 in the ridge 151.

[Method 2 of Producing Semiconductor Device]

A method 2 of producing the semiconductor device 200 will be described. FIGS. 14A, 14B, 14C, 15A, 15B, 15C, 16A, 16B, 16C, and 17 are each a schematic diagram showing a process of producing the semiconductor device 200.

Figure 14A:
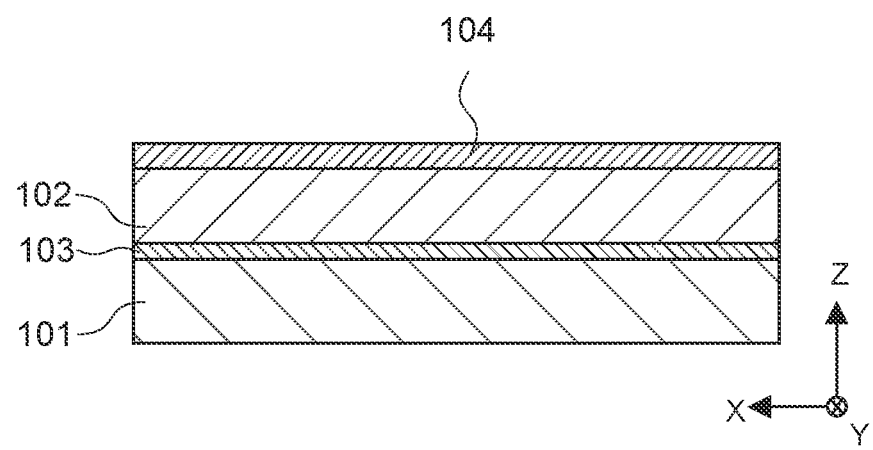
FIGS. 14A, 14B, and 14C are schematic diagrams showing a second process of producing the semiconductor device.

As shown in FIG. 14A, the transparent conductive layer 104 is formed on the p-type layer 102 of the laminate obtained by stacking the n-type layer 101, the active layer 103, and the p-type layer 102. The transparent conductive layer 104 can be formed by a method such as vapor deposition, sputtering, and plasma CVD (chemical vapor deposition). After forming the transparent conductive layer 104, annealing treatment may be performed. As a result, it is possible to realize favorable ohmic characteristics to the p-type layer 102.

Figure 14B:
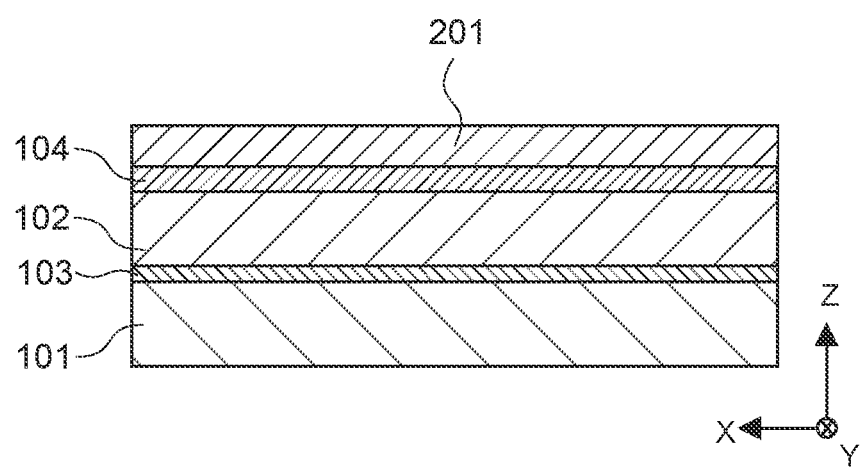

Subsequently, as shown in FIG. 14B, the p electrode 201 is formed on the transparent conductive layer 104.

Figure 14C:
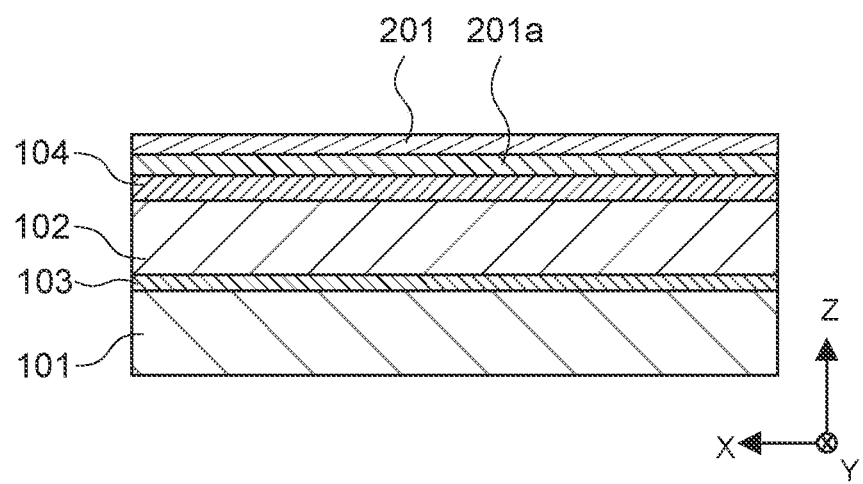

Subsequently, as shown in FIG. 14C, the intermediate layer 201a is formed. The intermediate layer 201a can be formed by mixing the constituent elements of the transparent conductive layer 104 and the constituent elements of the p electrode 201 by heat treatment.

Figure 15A:
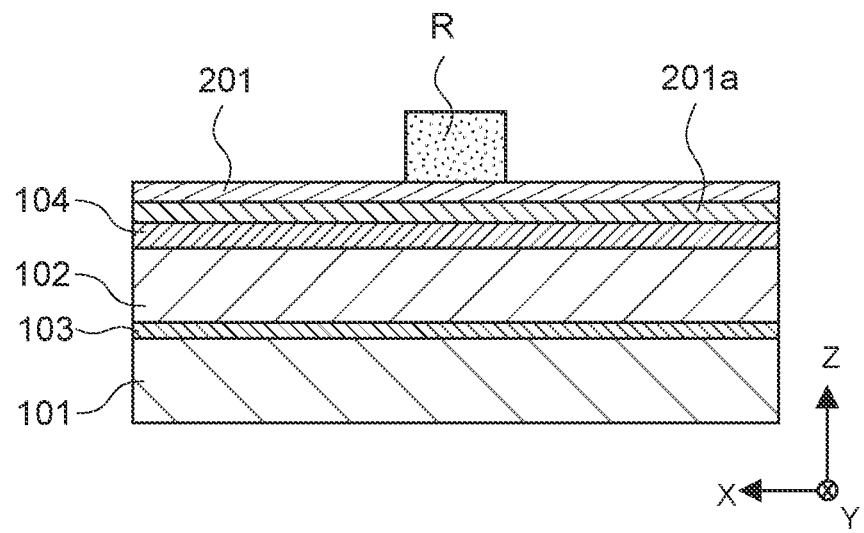
FIGS. 15A, 15B, and 15C are schematic diagrams showing the second process of producing the semiconductor device.
Figure 15B:
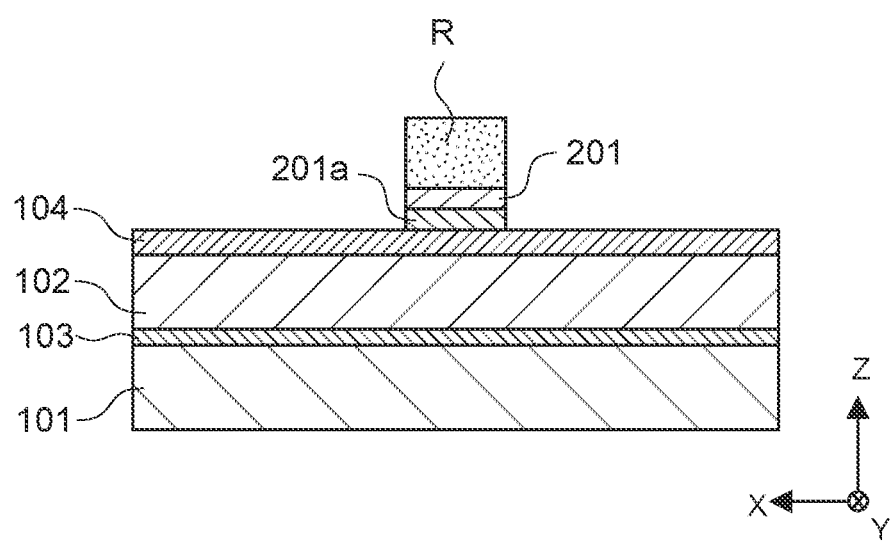

Subsequently, a photoresist is formed on the p electrode 201 and patterned to from the photoresist R as shown in FIG. 15A. The photoresist R is patterned into a stripe shape extending along the Y direction.

Subsequently, the p electrode 201 is etched using the photoresist R as a mask to process the p electrode 201 into a stripe shape as shown in Part (b) of FIG. 15. For etching, dry etching or wet etching can be used.

Figure 15C:
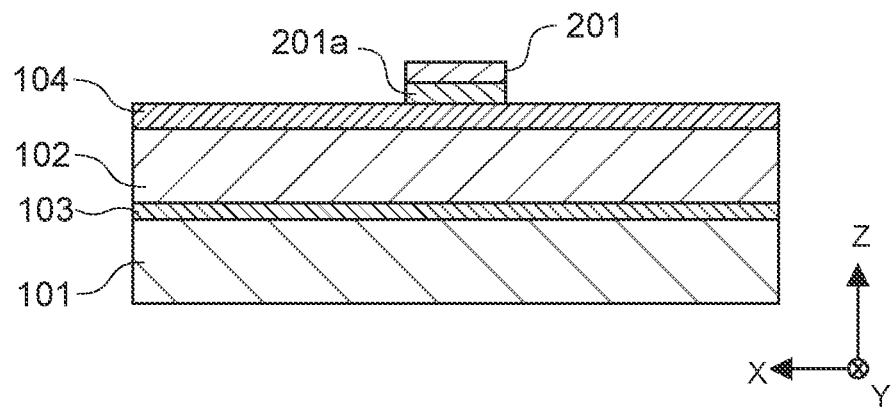

Subsequently, as shown in FIG. 15C, the photoresist R is removed.

Figure 16A:
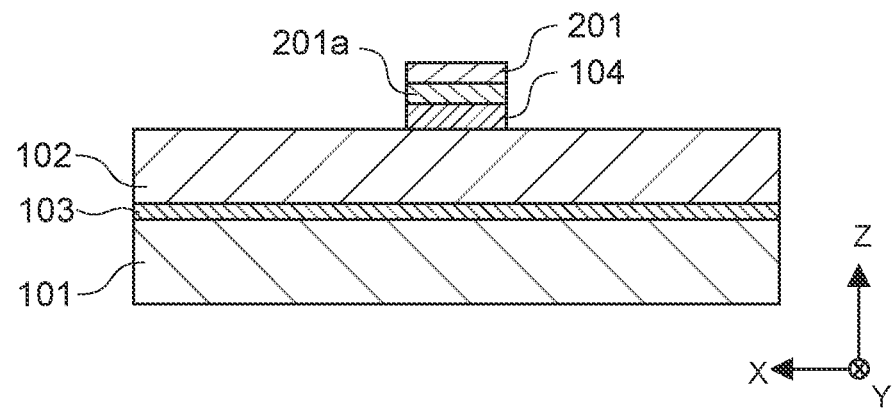
FIGS. 16A, 16B, and 16C are schematic diagrams showing the second process of producing the semiconductor device.

Subsequently, as shown in FIG. 16A, the transparent conductive layer 104 is etched using the p electrode 201 processed into a stripe shape as a mask to process the transparent conductive layer 104 into a stripe shape. For etching, dry etching or wet etching can be used. However, dry etching is favorable in view of control of the stripe width and flatness of the processed side surface. As an etchant, for example, a chlorine-based gas can be used.

Figure 16B:
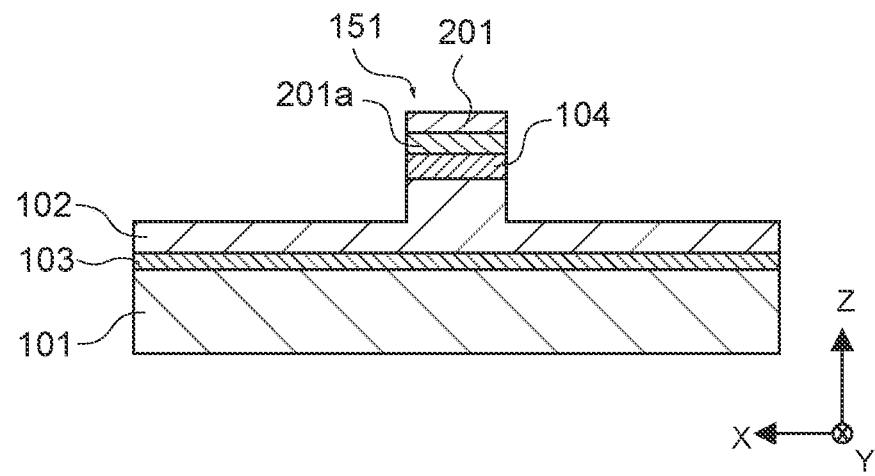

Subsequently, as shown in FIG. 16B, at least a part of the p-type layer 102 is etched using the p electrode 201 and the transparent conductive layer 104 that have been processed into a stripe shape as a mask to form the ridge 151. As an etchant, for example, a chlorine-based gas can be used. Note that this step may be performed separately from or together with the etching of the transparent conductive layer 104 (FIG. 16A). By forming the ridge 151 by this method, the transparent conductive layer 104 can be made to have a uniform thickness on the upper surface of the ridge 151, and the wide contact area between the transparent conductive layer 104 and the p-type layer 102 can be achieved.

Figure 16C:
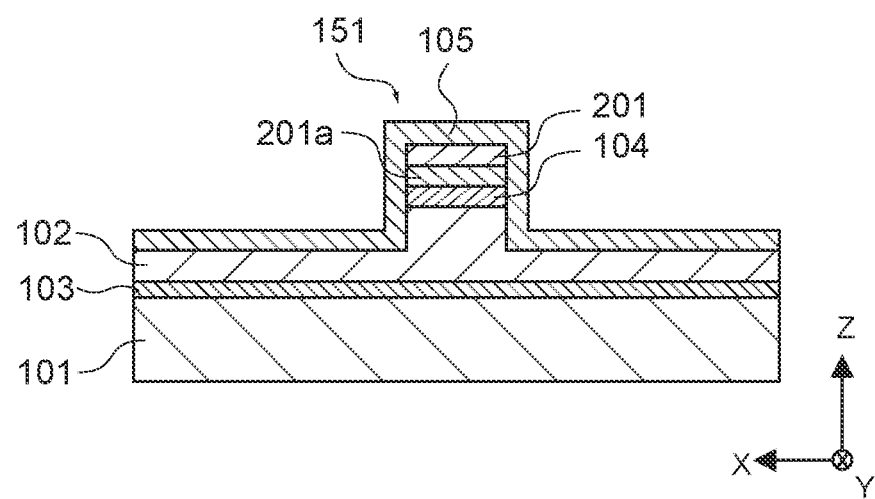

Subsequently, as shown in FIG. 16C, the dielectric layer 105 is formed on the p-type layer 102, the transparent conductive layer 104, and the p electrode 201.

Figure 17:
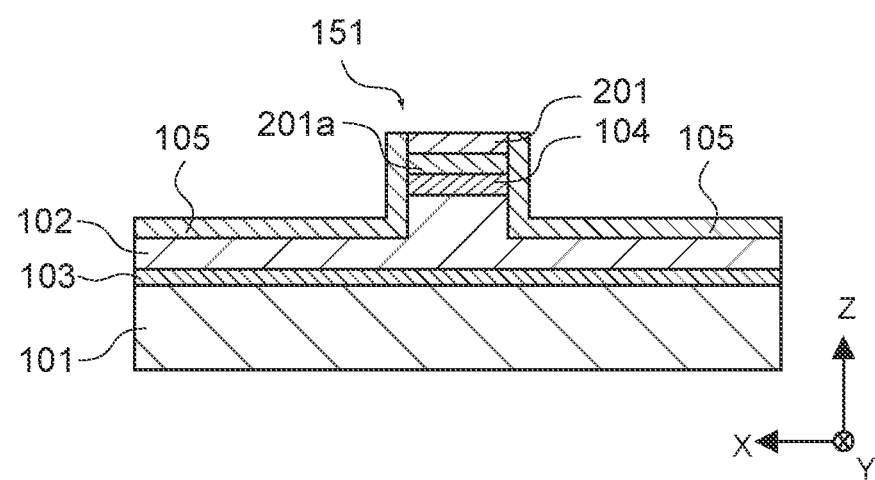
FIG. 17 is a schematic diagram showing the second process of producing the semiconductor device.

Subsequently, as shown in FIG. 17, the dielectric layer 105 on the ridge 151 is removed to expose the p electrode 201.

Subsequently, as shown in FIG. 9, the pad electrode 106 is formed so as to cover the entire ridge 151.

The semiconductor device 200 can be produced in this way. In this production method, the transparent conductive layer 104 can be made to have a uniform thickness on substantially the entire surface of the p-type layer 102 in the ridge 151.

(Regarding Display Apparatus)

The semiconductor device according to each of the first and second embodiments of the present technology can be favorably used as a light source of a display apparatus such as a raster scan projector.

It should be noted that the present technology may take the following configurations.

(1)

A semiconductor device, including:
a first semiconductor layer having a first conductivity type, a stripe-shaped ridge being formed on a surface of the first semiconductor layer;
a second semiconductor layer having a second conductivity type;
an active layer provided between the first semiconductor layer and the second semiconductor layer; and
a transparent conductive layer that is formed of a transparent conductive material and formed in the ridge, wherein
a second width is not less than 0.99 and not more than 1.0 times a first width, a third width is not less than 0.96 and not more than 1.0 times the second width, and the transparent conductive layer has a uniform thickness within a range of not less than 90% and not more than 110% in a range of the third width, the first width being a width of a surface of the ridge on which the transparent conductive layer is formed in a direction perpendicular to an extending direction of the ridge, the second width being a width of a surface of the transparent conductive layer on a side of the ridge in the direction, the third width being a width of a surface of the transparent conductive layer opposite to the ridge in the direction.

(2)

The semiconductor device according to (1) above, further including
a pad electrode that is formed of a conductive material and comes into contact with the transparent conductive layer, wherein
the pad electrode includes an intermediate layer formed on a connection part between the pad electrode and the transparent conductive layer, constituent elements of the pad electrode and constituent elements of the transparent conductive layer being fused in the intermediate layer.

(3)

The semiconductor device according to (1) above, further including
a metal electrode that is formed of a metal material and formed on the transparent conductive layer, wherein
the metal electrode includes an intermediate layer formed on a connection part between the metal electrode and the transparent conductive layer, constituent elements of the metal electrode and constituent elements of the transparent conductive layer being fused in the intermediate layer.

(4)

The semiconductor device according to (3) above, in which a fourth width is not less than 0.99 and not more than 1.0 times the third width, the fourth width being a width of a surface of the metal electrode on a side of the transparent conductive layer in the direction.

(5)

A semiconductor laser, including:

a first semiconductor layer having a first conductivity type, a stripe-shaped ridge being formed on a surface of the first semiconductor layer;

a second semiconductor layer having a second conductivity type;

an active layer provided between the first semiconductor layer and the second semiconductor layer; and a transparent conductive layer that is formed of a transparent conductive material and formed in the ridge, in which a second width is not less than 0.99 and not more than 1.0 times a first width, a third width is not less than 0.96 and not more than 1.0 times the second width, and the transparent conductive layer has a uniform thickness within a range of not less than 90% and not more than 110% in a range of the third width, the first width being a width of a surface of the ridge on which the transparent conductive layer is formed in a direction perpendicular to an extending direction of the ridge, the second width being a width of a surface of the transparent conductive layer on a side of the ridge in the direction, the third width being a width of a surface of the transparent conductive layer opposite to the ridge in the direction.

(6)

A method of producing a semiconductor device, including:

preparing a laminate including
    a first semiconductor layer having a first conductivity type,
    a second semiconductor layer having a second conductivity type, and
    an active layer provided between the first semiconductor layer and the second semiconductor layer;
forming a transparent conductive layer on the first semiconductor layer, the transparent conductive layer being formed of a transparent conductive material;
forming a mask structure processed into a stripe shape on the transparent conductive layer; and
removing at least a part of the transparent conductive layer and the first semiconductor layer by etching using the mask structure as an etching mask.

(7)

The method of producing a semiconductor device according to (6) above, in which the mask structure is formed of a dielectric.

(8)

The method of producing a semiconductor device according to (7) above, in which the forming the mask structure further includes
    forming a dielectric layer on the transparent conductive layer, the dielectric layer being formed of a dielectric,
    forming a photoresist on the dielectric layer,
    patterning the photoresist into a stripe shape, and
    etching the dielectric layer using the photoresist as an etching mask.

(9)

The method of producing an optical device according to (6), in which the mask structure is formed of metal.

(10)

The method of producing a semiconductor device according to (9) above, in which the forming the mask structure further includes
    forming a photoresist on the transparent conductive layer,
    patterning the photoresist into a shape having a stripe-shaped opening,
    forming a metal layer on the transparent conductive layer and the photoresist, and
    removing the photo resist and the metal layer formed on the photoresist.

(11)

The method of producing a semiconductor device according to (9), in which the forming the mask structure further includes
    forming a metal layer on the transparent conductive layer,
    forming a photoresist on the metal,
    patterning the photoresist into a stripe shape, and
    etching the metal layer using the photoresist as an etching mask.

(12)

The method of producing a semiconductor device according to (8) above, further including:

after the removing at least a part of the transparent conductive layer and the first semiconductor layer by etching,
    forming a pad electrode that comes into contact with the transparent conductive layer; and
    forming an intermediate layer in a connection part between the pad electrode and the transparent conductive layer by heat treatment, constituent elements of the pad electrode and constituent elements of the transparent conductive layer being fused in the intermediate layer.

(13)

The method of producing a semiconductor device according to (9) or (10) above, further including forming, after forming the metal layer on the transparent conductive layer, an intermediate layer in a connection part between the metal layer and the transparent conductive layer by heat treatment, constituent elements of the metal layer and constituent elements of the transparent conductive layer being fused in the intermediate layer.

REFERENCE SIGNS LIST 100 semiconductor device
101 n-type layer
102 p-type layer
103 active layer
104 transparent conductive layer
105 dielectric layer
106 pad electrode
106a intermediate layer
151 ridge
200 semiconductor device
201 p electrode
201a intermediate layer

The invention claimed is:

1. A method of producing a semiconductor device, the method comprising:
   preparing a laminate that includes:
      a first semiconductor layer having a first conductivity type;
      a second semiconductor layer having a second conductivity type; and
      an active layer between the first semiconductor layer and the second semiconductor layer, wherein
         the active layer is in direct contact with the first semiconductor layer and the second semiconductor layer,
         the active layer is on the second semiconductor layer, and
         the active layer entirely covers a surface of the second semiconductor layer;
   forming a transparent conductive layer on the first semiconductor layer, wherein the transparent conductive layer comprises a transparent conductive material;
   forming a mask structure on the transparent conductive layer, wherein the mask structure is processed into a stripe shape;
   removing at least a part of the transparent conductive layer and the first semiconductor layer, based on the mask structure, as an etching mask;
   forming a pad electrode on the transparent conductive layer; and
   forming an intermediate layer between the pad electrode and the transparent conductive layer by heat treatment.

2. The method of producing the semiconductor device according to claim 1, wherein the mask structure is formed of a dielectric.

3. The method of producing the semiconductor device according to claim 2, wherein the forming the mask structure further includes:
   forming a dielectric layer on the transparent conductive layer, wherein the dielectric layer is formed of the dielectric;
   forming a photoresist on the dielectric layer;
   patterning the photoresist into the stripe shape; and
   etching the dielectric layer using the photoresist as the etching mask.

4. The method of producing the semiconductor device according to claim 3, wherein
   the pad electrode is in contact with the transparent conductive layer;
   the intermediate layer is in a connection part between the pad electrode and the transparent conductive layer; and
   constituent elements of the pad electrode and constituent elements of the transparent conductive layer are fused in the intermediate layer.

5. The method of producing the semiconductor device according to claim 1, wherein the mask structure is formed of a metal.

6. The method of producing the semiconductor device according to claim 5, wherein the forming the mask structure further includes:
   forming a photoresist on the transparent conductive layer;
   patterning the photoresist into a shape having a stripe-shaped opening;
   forming a metal layer on the transparent conductive layer and the photoresist; and
   removing the photo resist and the metal layer formed on the photoresist.

7. The method of producing the semiconductor device according to claim 5, wherein the forming the mask structure further includes:
   forming a metal layer on the transparent conductive layer;
   forming a photoresist on the metal layer;
   patterning the photoresist into the stripe shape; and
   etching the metal layer using the photoresist as the etching mask.

8. The method of producing the semiconductor device according to claim 5, further comprising:
   forming a metal layer on the transparent conductive layer, wherein
      the intermediate layer is in a connection part between the metal layer and the transparent conductive layer, and
      constituent elements of the metal layer and constituent elements of the transparent conductive layer are fused in the intermediate layer.

9. A method of producing a semiconductor device, the method comprising:
   preparing a laminate that includes:
      a first semiconductor layer having a first conductivity type;
      a second semiconductor layer having a second conductivity type; and
      an active layer between the first semiconductor layer and the second semiconductor layer;
   forming a transparent conductive layer on the first semiconductor layer, wherein the transparent conductive layer comprises a transparent conductive material;
   forming a mask structure on the transparent conductive layer, wherein the mask structure is processed into a stripe shape and includes a metal;
   forming, after forming a metal layer on the transparent conductive layer, an intermediate layer in a connection part between the metal layer and the transparent conductive layer by heat treatment, wherein
      constituent elements of the metal layer and constituent elements of the transparent conductive layer are fused in the intermediate layer; and
   removing at least a part of the transparent conductive layer and the first semiconductor layer, based on the mask structure, as an etching mask.

* * * * *